(12) United States Patent
Tan

(10) Patent No.: US 7,545,649 B2
(45) Date of Patent: Jun. 9, 2009

(54) DOUBLE SIDED FLEXIBLE PRINTED CIRCUIT BOARD

(75) Inventor: Ming-Yen Tan, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/401,218

(22) Filed: Apr. 11, 2006

(65) Prior Publication Data

US 2006/0225914 A1 Oct. 12, 2006

(30) Foreign Application Priority Data

Apr. 12, 2005 (TW) ............................. 94111554 A

(51) Int. Cl.
*H05K 1/00* (2006.01)
(52) U.S. Cl. .................... 361/749; 361/750; 174/254
(58) Field of Classification Search ......... 174/254–258, 174/261; 361/749–750, 751, 807; 428/209
See application file for complete search history.

(56) References Cited

U.S. PATENT DOCUMENTS

| | | | |
|---|---|---|---|
| 4,338,149 A * | 7/1982 | Quaschner | 156/248 |
| 4,543,295 A * | 9/1985 | St. Clair et al. | 428/458 |
| 4,775,573 A * | 10/1988 | Turek | 428/209 |
| 4,931,134 A * | 6/1990 | Hatkevitz et al. | 216/17 |
| 5,004,639 A * | 4/1991 | Desai | 428/138 |
| 5,445,869 A * | 8/1995 | Ishikawa et al. | 428/209 |
| 6,288,343 B1 * | 9/2001 | Ahn et al. | 174/254 |
| 2006/0180344 A1 * | 8/2006 | Ito et al. | 174/262 |
| 2006/0234042 A1 * | 10/2006 | Yang et al. | 428/344 |

FOREIGN PATENT DOCUMENTS

| | | |
|---|---|---|
| CN | 1420714 A | 5/2003 |
| JP | 09-023052 A | 1/1997 |
| JP | 2002232086 A | 8/2002 |
| JP | 2002289984 A | 10/2002 |
| JP | 2003051648 A | 2/2003 |
| JP | 2004079731 | 3/2004 |
| TW | 29963 | 7/1997 |
| TW | 536101 | 6/2003 |

* cited by examiner

*Primary Examiner*—Tuan T Dinh
(74) *Attorney, Agent, or Firm*—Birch, Stewart, Kolasch & Birch, LLP

(57) ABSTRACT

A flexible printed circuit board includes a flexible substrate having a first region, a second region and a third region; a first conductive foil layer disposed on a lower surface of the flexible substrate, so as to cover the first region, the second region and the third region; a first cap layer disposed on the first conductive foil layer; an second conductive foil layer disposed on an upper surface of the flexible substrate, so as to cover the first region, part of the second region, and the third region, and to expose part of the flexible substrate on the second region; and a second cap layer disposed on the second conductive foil layer.

18 Claims, 5 Drawing Sheets

DOUBLE SIDED FLEXIBLE PRINTED CIRCUIT BOARD

This application claims the benefit of Taiwan Application Serial No. 094111554, filed Apr. 12, 2005, the subject matter of which is incorporated herein by reference.

FIELD OF THE INVENTION

The present invention relates to a flexible printed circuit board, more particularly to a double sided flexible printed circuit board.

BACKGROUND OF THE INVENTION

A printed circuit board (PCB) includes a layout of the circuit pattern designed on an insulating substrate in accordance to the connecting requirement of the electronic components fixed thereon. Therefore, the insulating substrate must undergo a certain machining process and surface treating process to form the circuit pattern. The circuit pattern can be formed on one side surface or double side surfaces of the layers in order to provide electrical interconnection among the electronic components. One type of printed circuit board is generally called "flexible printed circuit board", which includes at least one flexible substrate and which is light in weight, thin and is bendable, thereby providing several specific features.

The flexible printed circuit board is used widely in the notebook computer, LCD device, digital cameras, cellular phones and several consumer electric instruments. The manufacture of the electronic device is in the trend to produce in compact size, the intended region for layout of circuit traces in the flexible printed circuit board becomes lesser due to the increased number circuit traces in order to complement with the increased electronic components. In addition, flexibility of the printed circuit board is a must in order to dispose the same within a limited space of the compact size.

FIG. 1A shows a sectional view of a conventional flexible printed circuit board 10, and includes a substrate 11, upper and lower adhesive layers 12 disposed on top and bottom surfaces of the substrate 11 for holding upper and lower conductive layers 13, 13a. And upper and lower cap layers 14, 14a disposed above to cover the upper and lower conductive layers 13, 13a respectively via additional adhesive layers 12. The upper and lower conductive layers 13, 13a are generally made from thin copper foil. Since the upper and lower cap layers 14, 14a cover the entire surfaces of the upper and lower conductive layers (13, 13a), the conventional printed circuit board 10 has a relative stiffness and consequently provides little flexibility. As shown in FIG. 1B, the conventional double sided printed circuit board generally defines a foldable region 15, wherein a portion (in registry with the foldable region) of the upper conductive layer is removed in order to enhance the flexibility thereof, so that the conventional printed circuit board 10 can be folded when required into a configuration, as best shown in FIG. 1C.

With the increasing of circuit traces and electronic components, and the reducing of the layout area, the circuit traces must be formed on both sides of the substrate in the foldable region 15. The result is that the conventional printed circuit board has a considerable large stiffness.

SUMMARY OF THE INVENTION

The object of the present invention is to provide a double sided printed circuit board that has dielectric top or bottom layer, a portion of which is removed to expose a section of a substrate so as to enhance the flexibility of the printed circuit board.

In one aspect of the present invention, a double sided flexible printed circuit board is provided to include: a flexible substrate having a first region, a second region and a third region; a first conductive foil layer disposed on a lower surface of the flexible substrate, so as to cover the first region, the second region and the third region; a first cap layer disposed on the first conductive foil layer; an second conductive foil layer disposed on an upper surface of the flexible substrate, so as to cover the first region, part of the second region, and the third region, and to expose part of the flexible substrate on the second region; and a second cap layer disposed on the second conductive foil layer.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCCRIPTIONS OF THE PREFERRED EMBODIMENTS

Figure 1A:
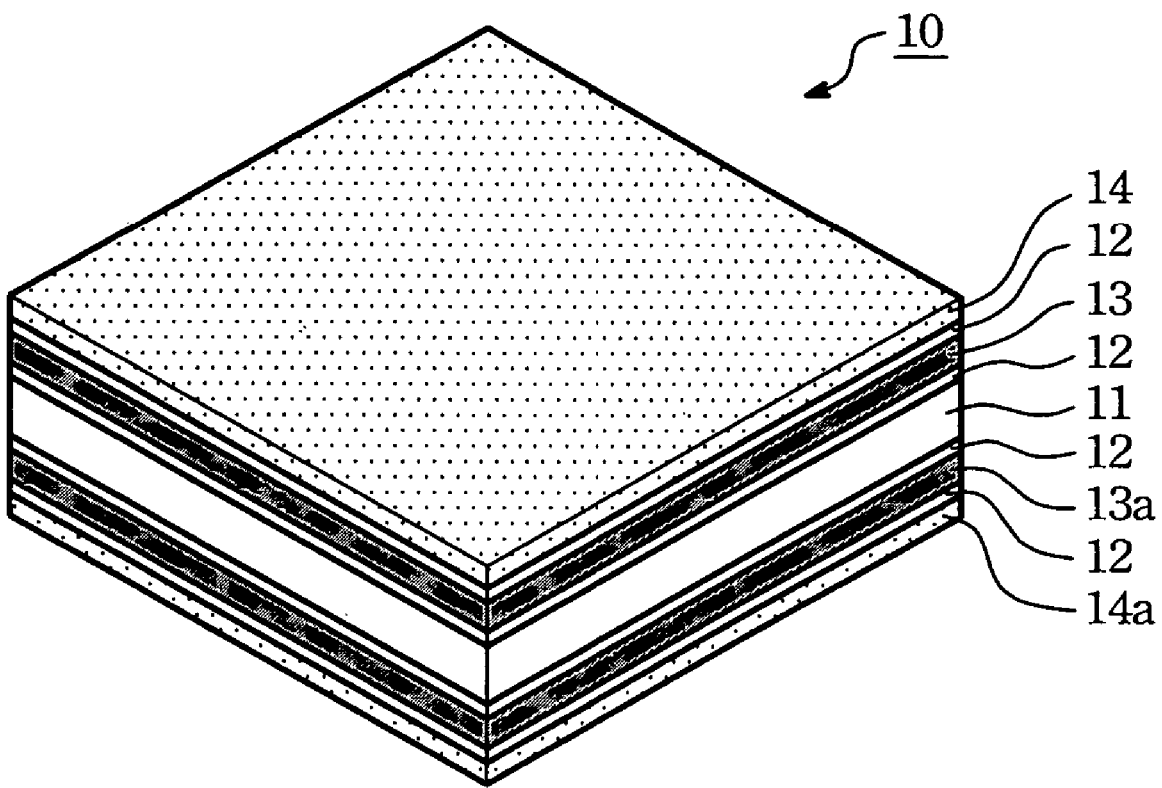
FIG. 1A shows a conventional flexible printed circuit board.
Figure 1:
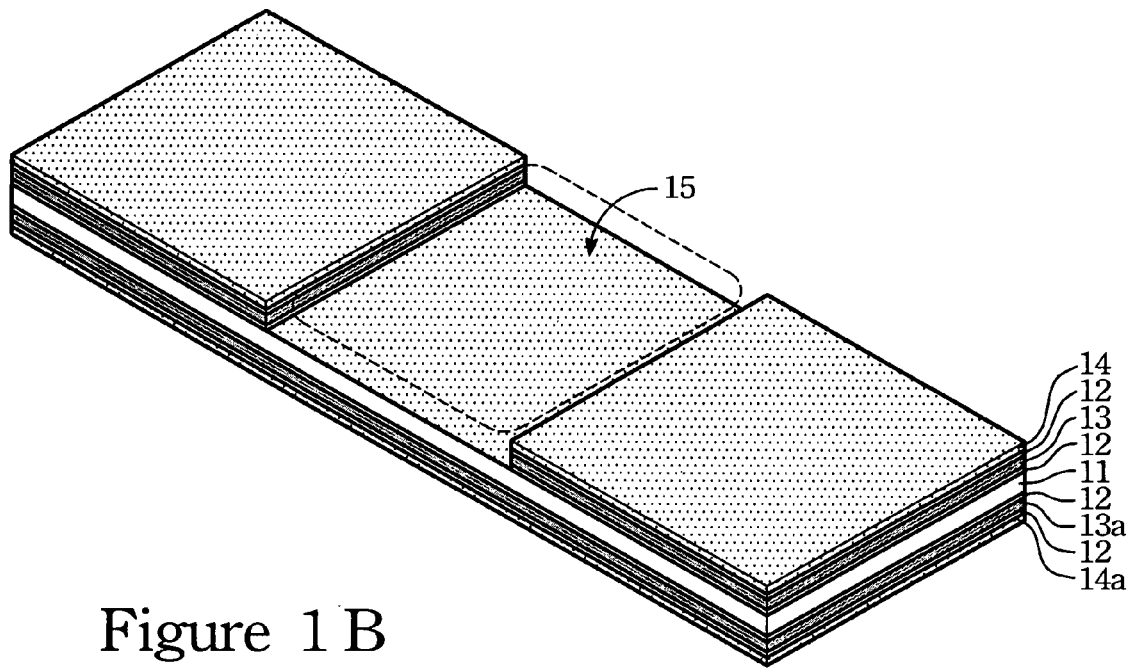
FIG. 1B shows the foldable region of the conventional flexible printed circuit board shown in FIG. 1A.
FIG. 1C illustrates the conventional printed circuit board of FIG. 1A in a folded manner.
Figure 1:
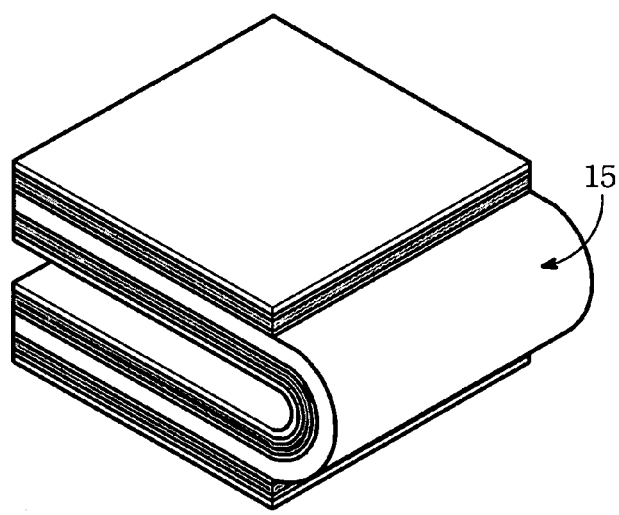
Figure 2:
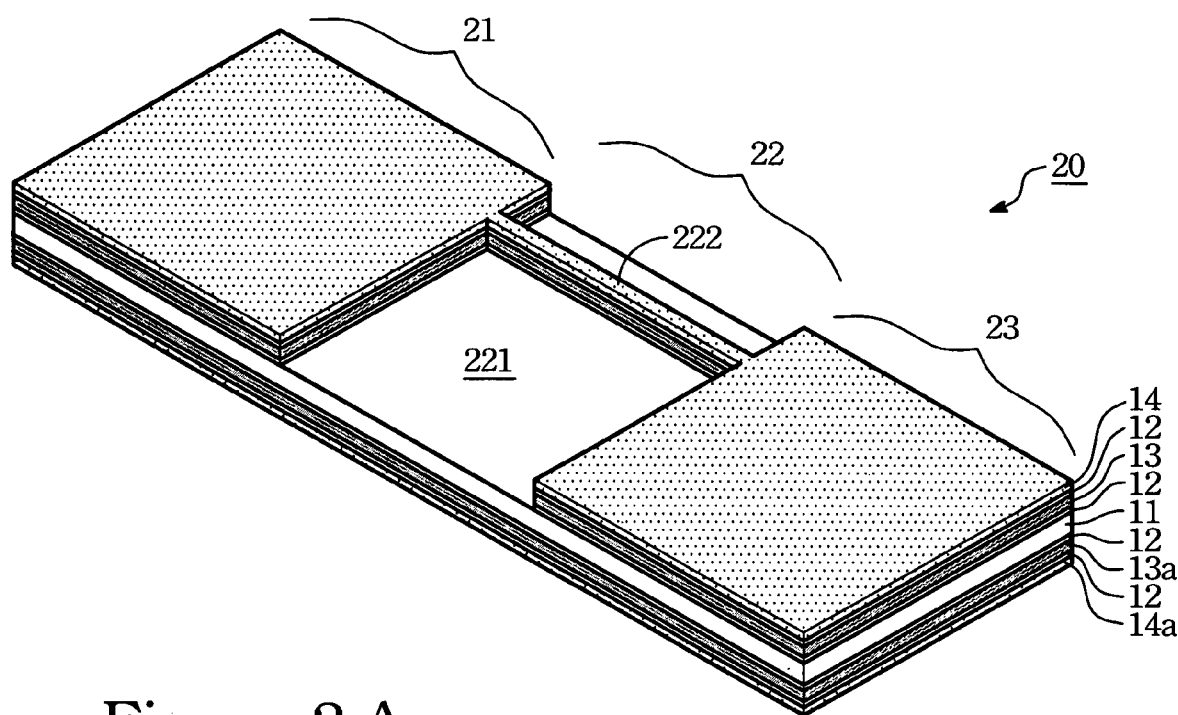
FIG. 2A shows a double-sided flexible printed circuit board of the present invention.
FIG. 2B shows the double-sided flexible printed circuit board of FIG. 2A in a foldable manner.
Figure 2:
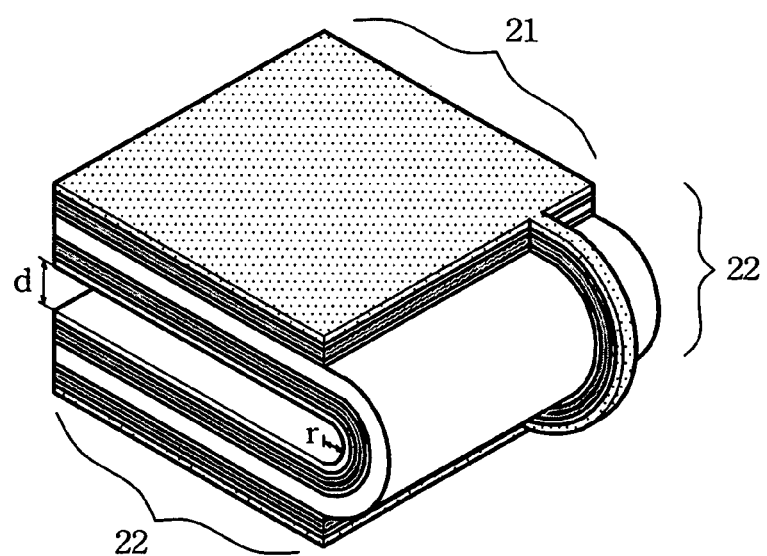

FIG. 2A shows that a flexible printed circuit board 20 includes a flexible substrate 11, a first conductive foil layer 13a, a first cap layer 14a, an second conductive foil layer 13 and an second cap layer 14. The flexible substrate 11 has a first region 21, a third region 23, and a second region 22 interposed between said first, third regions 21, 23. The first conductive foil layer 13a is disposed on a lower surface of the flexible substrate 11 for entirely covering the first and third regions 21, 23 and the second region 22. The first cap layer 14a is disposed on the first conductive foil layer 13a. The second conductive foil layer 13 is disposed on the upper surface of the flexible substrate 11 and covers the first and third regions 21, 23 and part of the second region 22 in such a manner to expose a portion of the flexible substrate 11. The second cap layer 14 is disposed on the second conductive foil layer 13.

A plurality of adhesive layers 12 are respectively disposed between the flexible substrate 11 and the second or first conductive foil layers 13, 13a, between the first conductive foil layer 13a and the first cap layer 14a, and between the second conductive foil layer 13 and the second cap layer 14. The second region 22 has a layout area 222 and a non-layout area 221. The layout area 222 is a long and narrow area across the second region 22. Two ends of the layout area 222 are respectively connected the first and third regions 21, 23. The flexible substrate 11 is exposed via the non-layout area 221. The layout area 222 makes it possible that the number of pins is increased on the upper surfaces of the flexible substrate 11. It is note that, even though the second conductive foil layer 13 and the second cap layer 14 are added in the layout area 222, the flexible substrate 11 is still easy to be bended via the second region 22 due to the layout area 222 being smaller than the non-layout area 221.

For keeping suitable flexibility, the thickness of each layer of the double sided flexible printed circuit board 20 is specified as follows. The flexible substrate 11 has a thickness ranging 1 to 2 mil (1 mil=10−3 inch). Each of the conductive foil layers 13, 13a has a thickness ranging 0.5-1 oz/ft². Each of the cap layers 14, 14a has a thickness ranging 0.5 to 1 mil. The adhesive layer 12 has a thickness ranging 0.4 to 1 mil.

The materials for each layer of the double sided flexible printed circuit board 20 are as below. The flexible substrate 11 is made from PET (polyethylene terephthalate), PI (polymide) or their derivatives. PI has better flame resistance so that it can be used for soldering. The second and first conductive foil layers 13, 13a are made from a roiled copper or an electrolytic copper. The rolled copper has better flexibility. The second and first cap layers 14, 14a can be also made from PET (polyethylene terephthalate), PI (polymide) or their derivatives. The adhesive layer 12 is made from acrylic resin or epoxy. The double sided flexible printed circuit board 20 can be made of a flexible copper clad laminate (FCCL) or an adhesiveless FCCL. The FCCL is made of the copper, the adhesive layer 12 and the flexible substrate 11. The adhesiveless FCCL is made of the copper and the flexible substrate. The FCCL or the adhesives FCCL can be etched to form a layout pattern.

FIG. 2B shows the result structure after bending the double sided flexible printed circuit board 20. As shown, the second region 22 has a curved side edge whose radius of curvature "r" is smaller than 2.5 mm. With the bending, the distance "d" between the first and third regions 21, 23 is shortened to 2 mm.

Figure 3:
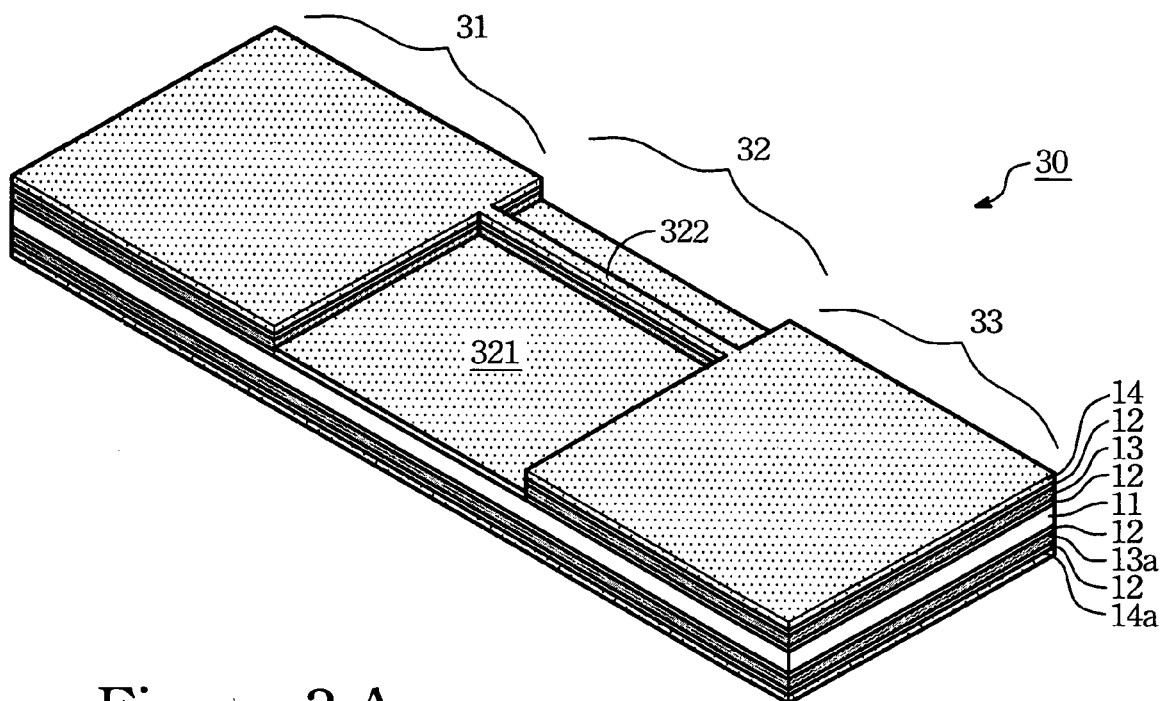
FIG. 3A is a second preferable embodiment of the double-sided flexible printed circuit board according to the present invention.
FIG. 3B shows the double-sided flexible printed circuit board of FIG. 3A in a foldable manner.
Figure 3:
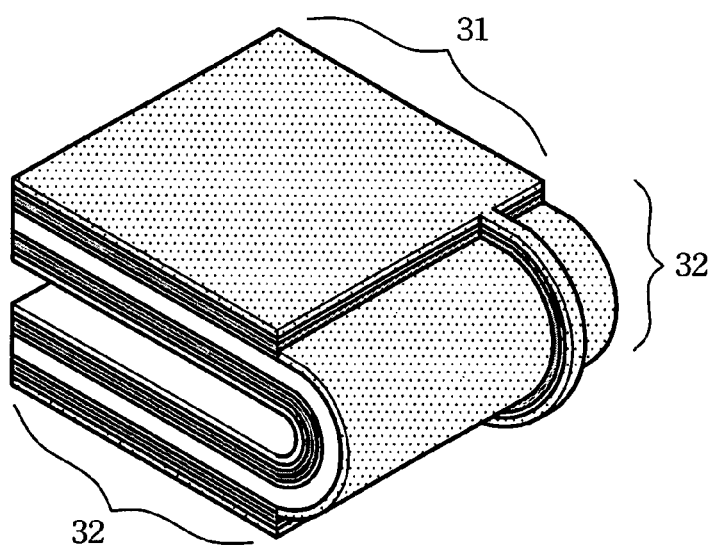

FIG. 3A is the second embodiment of the present invention. The schematic structure and material of the double sided flexible printed circuit board 30 is illustrated as FIG. 2A. In detail, the flexible substrate includes a first and a third regions 31, 33 and a second region 32. The second region 32 includes a layout area 322 the same as the layout area 22. The distinction is the second cap layer 14 is added in a non-layout area 321 of the second region 32 to avoid the exposed portion of the flexible substrate being damaged. Therefore, the second cap layer 14 covers an entire area of the second region 32 on the flexible substrate. FIG. 3B shows the result structure after bending the double sided flexible printed circuit board 30.

Figure 4:
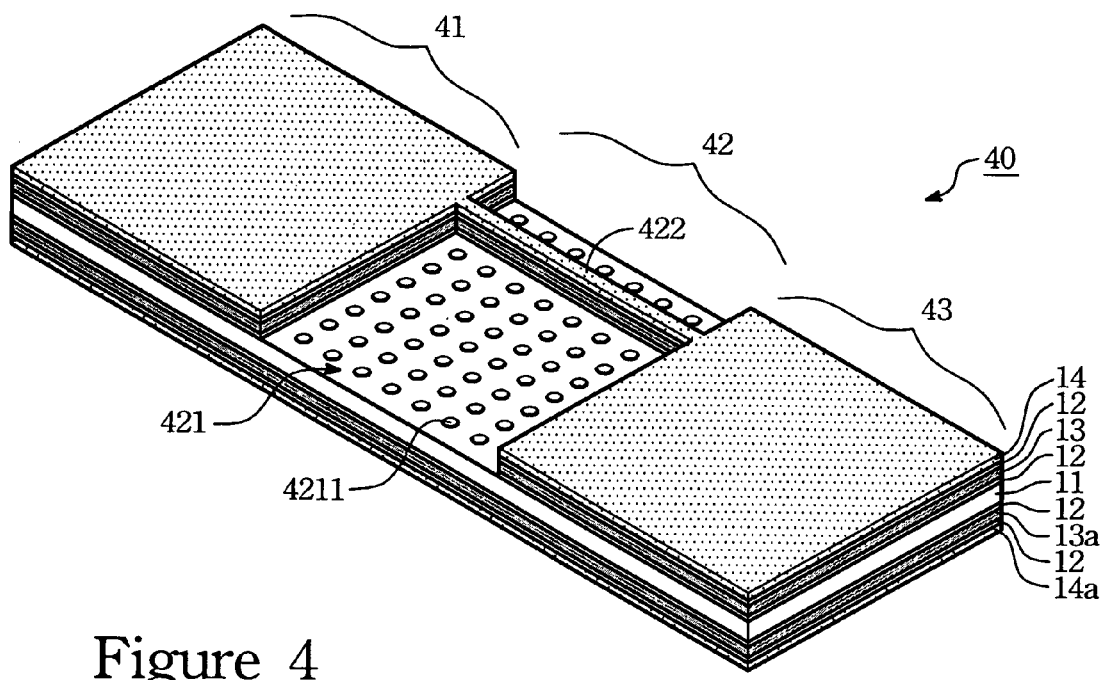
FIG. 4 is a third preferable embodiment of the double-sided flexible printed circuit board according to the present invention.

FIG. 4 is the third preferable embodiment of the present invention. The double sided flexible printed circuit board 40 includes a first and a third regions 41, 43 and a second region 42. A layout area 422 of the second region 42 has the same structure as the layout area 222 of FIG. 2A. For better flexibility, a plurality of holes are formed in a non-layout area 421 of the second region 42 to go through the exposed portion of the flexible substrate 11.

For manifold use, the shape of the first and third regions in above-mentioned embodiments can be changed. For example, it can be changed according to the shape of substrate or the layout pattern. The first and second conductive foil layers are etched to form a foil pattern. And also, the second conductive foil layer can be etched to form a bus line extending across said second region. After forming the conductive foil layers, anti-oxidation or chemical vapor deposition is provided to treat the surface of the conductive foil layers.

Figure 5:
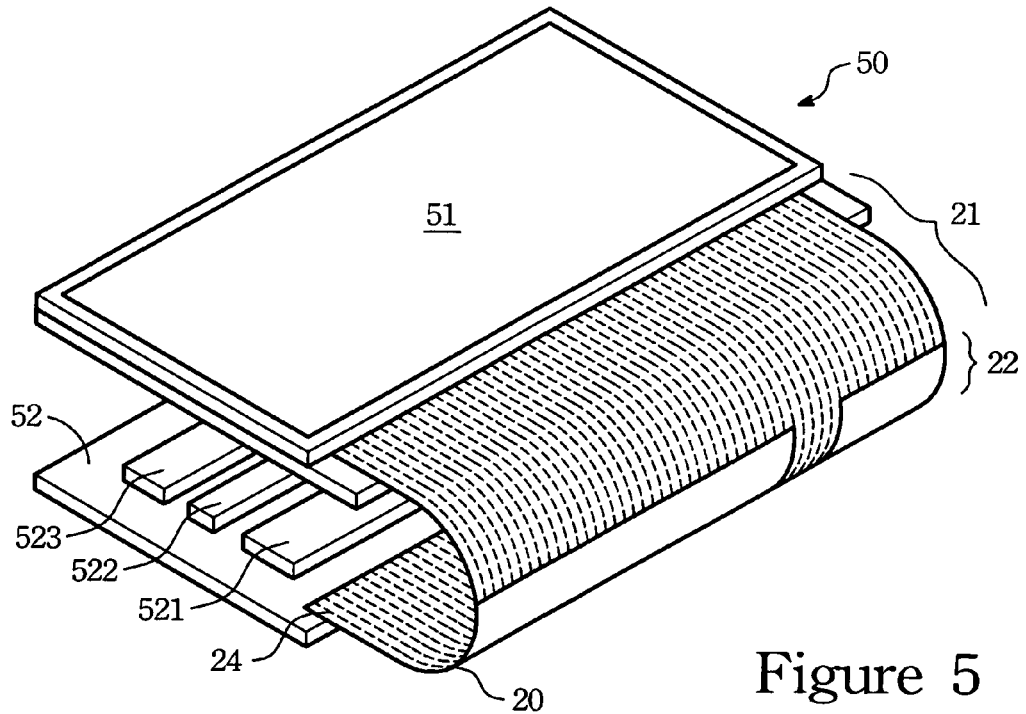
FIG. 5 is an electronic apparatus with the double-sided flexible printed circuit board of the present invention.

The flexible printed circuit board is uses as a movable portion of an electronic apparatus, a connection portion between inflexible printed circuit boards, or a connection portion between inflexible printed circuit boards and flexible printed circuit boards. FIG. 5 shows an electronic apparatus with the double-sided flexible printed circuit board of the present invention. The electronic apparatus 50 is just one example, but not to limit the application of the present invention. The electronic apparatus 50 includes a display panel 51 and a host board 52 connected to the display panel 51 via the double-sided printed circuit board 20. The display panel 51 can be a liquid crystal panel or an organic electroluminescent panel. The host board 52 has circuit elements like a memory 521, a micro processor 522 or other functional ICs 523. The second region 22 has a small-sized area for adhering the conductive foil layers and cap layers, but else area is exposed. Therefore, the double-sided flexible printed circuit board 20 remains suitable flexibility and has more shapes to combine with other circuit elements of electronic apparatus 50 more easily.

Comparing with the related art, the double-sided flexible printed circuit board of the present invention has dual-wiring in a portion of the second region, so that it has larger layout area, and better flexibility.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A double sided flexible printed circuit board, comprising:
   a flexible substrate having a first region, a second region, and a third region, wherein said second region located between said first region and said third region;
   a first conductive layer disposed on a lower surface of said flexible substrate, so as to cover said first region, said second region, and said third region;
   a first cap layer disposed on said first conductive layer;
   a second conductive layer disposed on an upper surface of said flexible substrate, so as to cover said first region, part of said second region, and said third region, and to expose part of said flexible substrate on said second region;
   a second cap layer disposed on said second conductive layer; and a through hole penetrating said flexible printed circuit board in said exposed part of said flexible substrate on said second region.

2. The double sided flexible printed circuit board according to claim 1, wherein said flexible substrate is substantially made of PET (polyethylene terephthalate), PI (polymide), or derivatives thereof.

3. The double sided flexible printed circuit board according to claim 1, wherein said first and second conductive layers are substantially made of rolled copper or electrolytic copper.

4. The double sided flexible printed circuit board according to claim 1, wherein said second and first cap layers are substantially made of PET (polyethylene terephthalate), PI (polymide), or derivatives thereof.

5. The double sided flexible printed circuit board according to claim 1, wherein said flexible substrate has a thickness ranging from about 1 mil to about 2 mil (1 mil=10-3 inch).

6. The double sided flexible printed circuit board according to claim 1, wherein each of said first and second conductive layers has a weight per unit area ranging from about 0.5 oz/ft$^2$ to about 1 oz/ft$^2$.

7. The double sided flexible printed circuit board according to claim 1, wherein each of said second and first cap layers has a thickness ranging from about 0.5 mil to about 1 mil.

8. The double sided flexible printed circuit board 1, wherein said second cap layer covers an entire area of said second region in said flexible substrate.

9. The double sided flexible printed circuit board 1, wherein said second conductive layer has a bus line.

10. A double sided flexible printed circuit board, comprising:
   a flexible substrate having a first region, a second region, and a third region, wherein said second region located between said first region and said third region;
   a first conductive layer disposed on a lower surface of said flexible substrate, so as to cover said first region, said second region, and said third region;
   a first cap layer disposed on said first conductive layer;
   a second conductive layer disposed on an upper surface of said flexible substrate, so as to cover said first region, part of said second region, and said third region, and to expose part of said flexible substrate on said second region;
   a second cap layer disposed on said second conductive layer;
   wherein each of said first and second conductive layers has a plurality of metal lines.

11. The double sided flexible printed circuit board according to claim 10, wherein said flexible substrate is substantially made of PET (polyethylene terephthalate), PI (polymide), or derivatives thereof.

12. The double sided flexible printed circuit board according to claim 10, wherein said first and second conductive layers are substantially made of rolled copper or electrolytic copper.

13. The double sided flexible printed circuit board according to claim 10, wherein said second and first cap layers are substantially made of PET (polyethylene terephthalate), PI (polymide), or derivatives thereof.

14. The double sided flexible printed circuit board according to claim 10, wherein said flexible substrate has a thickness ranging from about 1 mil to about 2 mil (1 mil=10-3 inch).

15. The double sided flexible printed circuit board according to claim 10, wherein each of said first and second conductive layers has a weight per unit area ranging from about 0.5 oz/ft$^2$ to about 1 oz/ft$^2$.

16. The double sided flexible printed circuit board according to claim 10, wherein each of said second and first cap layers has a thickness ranging from about 0.5 mil to about 1 mil.

17. The double sided flexible printed circuit board 10, wherein said second cap layer covers an entire area of said second region in said flexible substrate.

18. The double sided flexible printed circuit board 10, wherein said second conductive layer has a bus line.

* * * * *